US008846195B2

(12) United States Patent
Xu et al.

(10) Patent No.: US 8,846,195 B2
(45) Date of Patent: *Sep. 30, 2014

(54) ULTRA-THIN POLYMERIC ADHESION LAYER

(75) Inventors: Frank Y. Xu, Round Rock, TX (US); Edward Brian Fletcher, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 1331 days.

This patent is subject to a terminal disclaimer.

(21) Appl. No.: 12/326,709

(22) Filed: Dec. 2, 2008

(65) Prior Publication Data

US 2009/0155583 A1 Jun. 18, 2009

Related U.S. Application Data

(63) Continuation-in-part of application No. 11/187,406, filed on Jul. 22, 2005, and a continuation-in-part of application No. 11/187,407, filed on Jul. 22, 2005, and a continuation-in-part of application No. 11/734,542, filed on Apr. 12, 2007.

(60) Provisional application No. 60/992,179, filed on Dec. 4, 2007.

(51) Int. Cl.
*B32B 27/38* (2006.01)
*B32B 27/04* (2006.01)
*G03F 7/038* (2006.01)
*B82Y 40/00* (2011.01)
*B82Y 10/00* (2011.01)
*B82Y 30/00* (2011.01)
*G03F 7/00* (2006.01)

(52) U.S. Cl.
CPC ............ *G03F 7/0002* (2013.01); *G03F 7/0388* (2013.01); *B82Y 40/00* (2013.01); *B82Y 10/00* (2013.01); *B82Y 30/00* (2013.01)
USPC ...................... 428/339; 427/207.1; 427/208.6; 427/208.8; 427/271; 427/369; 428/354; 428/355 R; 428/355 EP; 428/333; 428/336

(58) Field of Classification Search
USPC ........ 423/354, 355 R, 355 EP, 333, 336, 339; 427/207.1, 208.6, 208.8, 271, 369
See application file for complete search history.

(56) References Cited

U.S. PATENT DOCUMENTS

| | | | |
|---|---|---|---|
| 3,498,827 A * | 3/1970 | Vanderbilt et al. ........... 428/35.9 |
| 4,506,003 A | 3/1985 | Ruckert et al. |
| 5,368,942 A | 11/1994 | Smith et al. |
| 5,432,700 A | 7/1995 | Hrovat et al. |
| 5,458,953 A | 10/1995 | Wang et al. |
| 5,545,367 A | 8/1996 | Bae et al. |
| 5,550,196 A | 8/1996 | Spence et al. |
| 5,578,683 A | 11/1996 | Koch et al. |
| 5,731,092 A | 3/1998 | Breant et al. |
| 5,750,753 A | 5/1998 | Kimae et al. |
| 5,942,302 A | 8/1999 | Ha et al. |
| 6,518,168 B1 | 2/2003 | Clem et al. |
| 6,610,458 B2 | 8/2003 | Miller et al. |
| 6,667,082 B2 | 12/2003 | Bamore et al. |
| 6,719,915 B2 | 4/2004 | Willson et al. |
| 6,720,076 B2 | 4/2004 | McBain |
| 6,873,087 B1 | 3/2005 | Choi et al. |
| 6,932,934 B2 | 8/2005 | Choi et al. |
| 6,936,194 B2 | 8/2005 | Watts |
| 6,957,608 B1 | 10/2005 | Hubert et al. |
| 7,011,932 B2 | 3/2006 | Ferm et al. |
| 7,141,188 B2 | 11/2006 | Li et al. |
| 7,157,036 B2 | 1/2007 | Choi et al. |
| 7,163,888 B2 | 1/2007 | Gehoski et al. |
| 7,241,823 B2 | 7/2007 | Kashiwagi et al. |
| 7,307,118 B2 | 12/2007 | Xu et al. |
| 7,309,225 B2 | 12/2007 | McMackin et al. |
| 7,338,275 B2 | 3/2008 | Choi et al. |
| 7,365,103 B2 | 4/2008 | Willson et al. |
| 7,393,789 B2 | 7/2008 | Abatchev et al. |

(Continued)

FOREIGN PATENT DOCUMENTS

DE 10237280 A1 3/2004
EP 0592139 4/1994

(Continued)

OTHER PUBLICATIONS

Schenectady International, Inc Technical Data Sheet for IsoRad™ 501. [online], [retrieved on Oct. 18, 2011]. Retrieved from the Internet <URL: www.siigroup.com/product_documents/IsoRad501.PDF>.*
Wacker Chemie AG. Technical Brochure for Geniosil (2011) retrieved online on 4/6/08/2012]. Retrieved from URL:<http://www.wacker.com/cms/media/publications/downloads/6085_EN.pdf>.*
Colburn et al., Development and advantages of step-and-flash lithography, Solid State Technology, Jul. 2001, 11 pages.
Taniguchi et al., "Measurement of Adhesive Forces Between Mold and Photocurable Resin in Imprint Technology," Jpn. J. Appl. Phys. vol. 41 (2002) Pt. 1, No. 6B, pp. 194-197.
International Search Report for Publication No. WO/2009/085090, dated Jun. 1, 2009, 1 page.
International Search Report for Publication No. for WO/2007/050133, dated Sep. 13, 2007, 1 page.
International Search Report for Publication No. for WO/2008/127835, dated Jun. 25, 2008, 2 pages.
Peeters et al., "17O-NMR of Sol-Gel Processes of TEOS and TMOS," Journal of Sol-Gel Science and Technology 13 (1998) 71-74.

(Continued)

Primary Examiner — Sanza McClendon
(74) Attorney, Agent, or Firm — Heather L. Flanagan; Fish & Richardson P.C.; Cameron A. King

(57) ABSTRACT

An imprint lithography imprinting stack includes a substrate and a polymeric adhesion layer adhered to the substrate. The polymeric adhesion layer includes polymeric components with an extended backbone length of at least about 2 nm. The backbones of the polymeric components may be substantially aligned in a planar configuration on the surface of the substrate, such that a thickness of the polymeric adhesion layer is less than about 2 nm.

17 Claims, 6 Drawing Sheets

(56) References Cited

U.S. PATENT DOCUMENTS

| | | |
|---|---|---|
| 7,431,858 B2 * | 10/2008 | Spiess et al. .................. 216/67 |
| 7,727,453 B2 | 6/2010 | Sreenivasan et al. |
| 7,837,921 B2 | 11/2010 | Xu et al. |
| 2002/0094496 A1 | 7/2002 | Choi et al. |
| 2002/0123592 A1 | 9/2002 | Zhang et al. |
| 2003/0017368 A1 | 1/2003 | Wu et al. |
| 2003/0235787 A1 | 12/2003 | Watts et al. |
| 2004/0037956 A1 | 2/2004 | Yang |
| 2004/0065252 A1 | 4/2004 | Sreenivasan et al. |
| 2004/0065976 A1 | 4/2004 | Sreenivasan et al. |
| 2004/0110096 A1 | 6/2004 | Kishioka et al. |
| 2004/0116548 A1 | 6/2004 | Willson et al. |
| 2004/0124566 A1 | 7/2004 | Sreenivasan et al. |
| 2004/0127613 A1 | 7/2004 | Kashiwagi et al. |
| 2004/0157078 A1 | 8/2004 | Yoshida |
| 2004/0168613 A1 | 9/2004 | Nguyen et al. |
| 2004/0175631 A1 | 9/2004 | Crocker et al. |
| 2004/0188381 A1 | 9/2004 | Sreenivasan et al. |
| 2004/0191429 A1 | 9/2004 | Patrick |
| 2004/0211754 A1 | 10/2004 | Sreenivasan et al. |
| 2004/0259992 A1 | 12/2004 | Gobel |
| 2005/0098534 A1 | 5/2005 | Sreenivasan et al. |
| 2005/0160934 A1 | 7/2005 | Xu et al. |
| 2005/0187339 A1 | 8/2005 | Xu et al. |
| 2005/0224452 A1 | 10/2005 | Spiess et al. |
| 2006/0029811 A1 | 2/2006 | Sugioka et al. |
| 2006/0030071 A1 | 2/2006 | Mizukoshi et al. |
| 2006/0030653 A1 | 2/2006 | Hu et al. |
| 2006/0046069 A1 | 3/2006 | Jung et al. |
| 2006/0062867 A1 | 3/2006 | Choi et al. |
| 2006/0062922 A1 | 3/2006 | Xu et al. |
| 2006/0081557 A1 | 4/2006 | Xu et al. |
| 2006/0108710 A1 | 5/2006 | Xu et al. |
| 2006/0145398 A1 | 7/2006 | Bailey et al. |
| 2006/0175736 A1 | 8/2006 | Xu et al. |
| 2006/0188751 A1 | 8/2006 | Okawa et al. |
| 2006/0222897 A1 | 10/2006 | Kamata et al. |
| 2006/0279024 A1 | 12/2006 | Choi et al. |
| 2007/0017631 A1 | 1/2007 | Xu |
| 2007/0021520 A1 | 1/2007 | Xu |
| 2007/0042173 A1 | 2/2007 | Nagaoka et al. |
| 2007/0051697 A1 | 3/2007 | DiPietro et al. |
| 2007/0059211 A1 | 3/2007 | Edmiston |
| 2007/0212494 A1 | 9/2007 | Xu et al. |
| 2007/0272825 A1 | 11/2007 | Xu et al. |
| 2008/0110557 A1 | 5/2008 | Xu |
| 2008/0131623 A1 | 6/2008 | Zhang et al. |
| 2008/0138460 A1 * | 6/2008 | Heidari et al. ............ 425/436 R |
| 2009/0136654 A1 | 5/2009 | Xu et al. |
| 2009/0197057 A1 | 8/2009 | Xu et al. |
| 2010/0112236 A1 | 5/2010 | Fletcher et al. |
| 2011/0165412 A1 | 7/2011 | Ye et al. |

FOREIGN PATENT DOCUMENTS

| | | |
|---|---|---|
| EP | 0592972 | 4/1994 |
| EP | 592972 A2 * | 4/1994 |
| EP | 1533657 | 5/2005 |
| JP | 61040845 Y2 | 11/1986 |
| JP | 4330650 | 11/1992 |
| JP | 8208781 A | 8/1996 |
| JP | 9502406 A | 3/1997 |
| JP | 2002060529 | 2/2002 |
| JP | 2002285071 A | 10/2002 |
| JP | 2002355543 A | 12/2002 |
| JP | 2004051706 | 2/2004 |
| KR | 10-0153746 | 11/1998 |
| WO | WO 91/04151 | 4/1991 |
| WO | WO9600656 A1 | 1/1996 |
| WO | WO0163605 A1 | 8/2001 |
| WO | WO03087935 A2 | 10/2003 |
| WO | WO 03087935 A2 * | 10/2003 |
| WO | WO/2004/021083 | 3/2004 |
| WO | WO2004097518 A2 | 11/2004 |
| WO | WO2007050133 | 5/2007 |
| WO | WO2008127835 | 10/2008 |
| WO | WO/2009/085090 | 7/2009 |
| WO | WO2010051024 A1 | 5/2010 |

OTHER PUBLICATIONS

Bender, M.; "Multiple imprinting UV-based nanoimprint lithography: related material issues;" Microelectronic Engineering; 2002; pp. 407-413; Elsevier Science B.V.

Supplementary European Search Report, Application No. EP 08744071; Dec. 22, 2010.

Matinlinna et al., The effect of a novel silane blend system on resin bond strength to silica-coated Ti substrate. Journal of Denistry, 34, 2005 (online print date), 436-443.

PCT/US2010/058089 International Search Report and Written Opinion, PCT, Aug. 29, 2011, 12 pages.

Haisma et al. Mold-assisted Nanolithography: A Process for Reliable Pattern Replication; J. Vac. Sci. Technol. B, pp. 4124-4128 Nov. 1, 1996.

* cited by examiner

ULTRA-THIN POLYMERIC ADHESION LAYER

CROSS-REFERENCE TO RELATED APPLICATIONS

This application claims the benefit under 35 U.S.C. §119 (e)(1) of U.S. provisional application 60/992,179, filed Dec. 4, 2007, which is hereby incorporated by reference herein. This application is also a continuation-in-part under 35 U.S.C §120 of U.S. patent application Ser. Nos. 11/187,406 and 11/187,407 filed on Jul. 22, 2005 and U.S. patent application Ser. No. 11/734,542, filed on Apr. 12, 2007, all of which are hereby incorporated by reference herein. U.S. patent application Ser. No. 11/734,542 is a continuation-in-part of U.S. patent application Ser. Nos. 11/187,406 and 11/187,407.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

TECHNICAL FIELD

The field of invention relates generally to nano-fabrication of structures. More particularly, the present invention is directed to an ultra-thin polymeric adhesion layer.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Application Publication No. 2004/0065976, U.S. Patent Application Publication No. 2004/0065252, and U.S. Pat. No. 6,936,194, all of which are hereby incorporated by reference herein.

An imprint lithography technique disclosed in each of the aforementioned U.S. patent application publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and the formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

SUMMARY

In one aspect, an imprint lithography imprinting stack includes a substrate and a polymeric adhesion layer adhered to the substrate. In another aspect, an adhesion layer is formed on an imprint lithography substrate by spin-coating a polymerizable composition onto an imprint lithography substrate, and solidifying the polymerizable composition to form a polymeric adhesion layer adhered to the imprint lithography substrate. In yet another aspect, a polymerizable composition is spin-coated on an imprint lithography substrate. The polymerizable composition includes polymeric components with an extended backbone length of at least about 2 nm. The backbones of the polymeric components are substantially aligned in a planar configuration along a surface of the imprint lithography substrate. The polymerizable composition is solidified to form a polymeric adhesion layer. A thickness of the polymeric adhesion layer is less than about 2 nm.

In some implementations, a thickness of the polymeric adhesion layer is about 1 nm. The polymeric adhesion layer may be formed from a composition including a polymeric component with an extended backbone length of at least about 2 nm. In some cases, the polymeric component is synthesized from a compound including an aromatic group. In certain cases, the polymeric component is synthesized from a cresol epoxy novolac. In some embodiments, the polymeric component includes a carboxylic functional group capable of bonding to the substrate and an additional functional group capable of bonding with an imprint resist. The polymeric adhesion layer may be capable of bonding with an imprint resist during solidification of the imprint resist on the imprinting stack.

BRIEF DESCRIPTION OF THE DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION OF THE INVENTION

Figure 1:
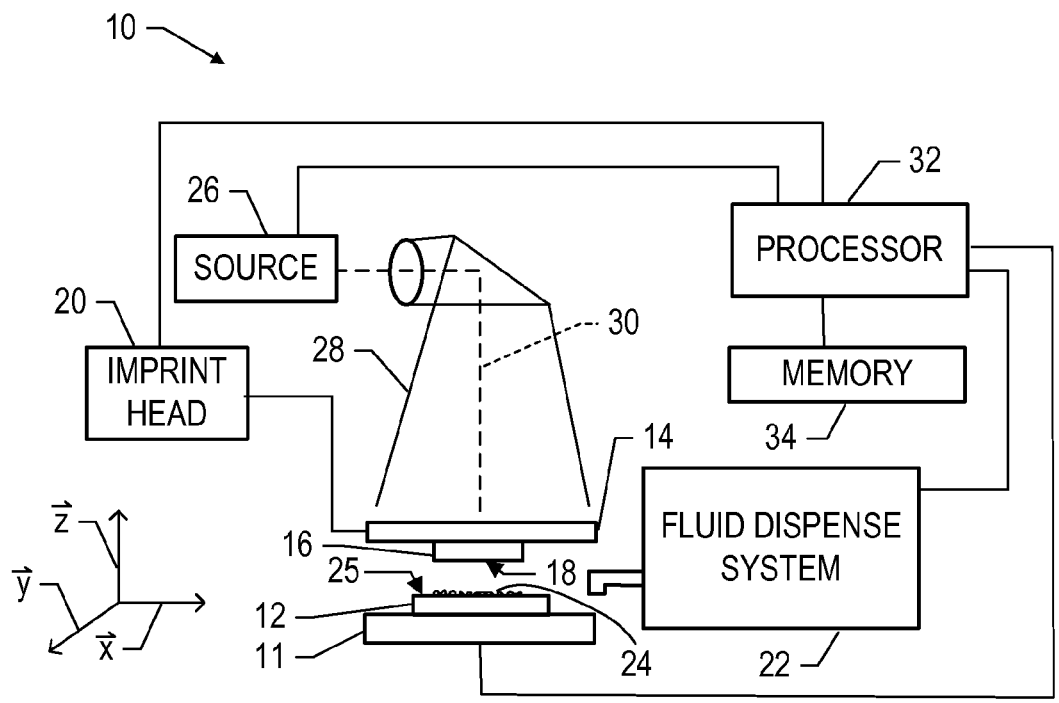
FIG. 1 is a simplified plan view of a lithographic system in accordance with the prior art.
Figure 2:
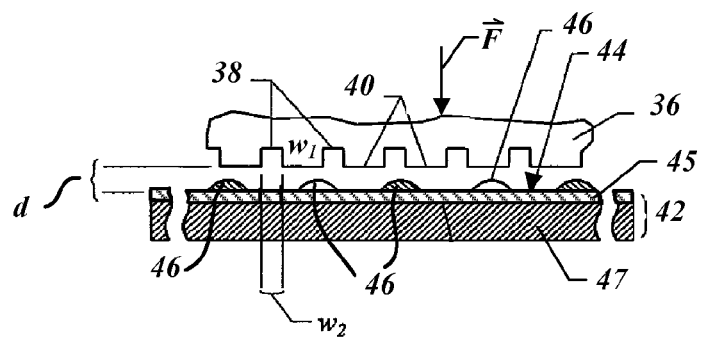
FIG. 2 is a simplified elevation view of a template and imprinting material disposed on a substrate in accordance with the present invention.

Referring to FIGS. 1 and 2, a mold 36, in accordance with the present invention, may be employed in system 10, and may define a surface having a substantially smooth or planar profile (not shown). Alternatively, mold 36 may include features defined by a plurality of spaced-apart recessions 38 and protrusions 40. The plurality of features defines an original pattern that forms the basis of a pattern to be formed on a substrate 42. Substrate 42 may comprise a bare wafer or a wafer with one or more layers disposed thereon, one of which is shown as primer layer 45. To that end, reduced is a distance "d" between mold 36 and substrate 42. In this manner, the features on mold 36 may be imprinted into a conformable region of substrate 42, such as an imprinting material disposed on a portion of surface 44 that presents a substantially planar profile. It should be understood that the imprinting material may be deposited using any known technique, e.g., spin-coating, dip coating and the like. In the present example, however, the imprinting material is deposited as a plurality of spaced-apart discrete droplets 46 on substrate 42. Imprinting material is formed from a composition that may be selectively polymerized and cross-linked to record the original pattern therein, defining a recorded pattern.

Specifically, the pattern recorded in the imprinting material is produced, in part, by interaction with mold 36, e.g., electrical interaction, magnetic interaction, thermal interaction, mechanical interaction or the like. In the present example, mold 36 comes into mechanical contact with the imprinting material, spreading droplets 36, so as to generate a contiguous formation 50 of the imprinting material over surface 44. In one embodiment, distance "d" is reduced to allow sub-portions 52 of imprinting material to ingress into and fill recessions 38. To facilitate filling of recessions 38, before contact between mold 36 and droplets 46, the atmosphere between mold 36 and droplets 46 is saturated with helium or is completely evacuated or is a partially evacuated atmosphere of helium.

The imprinting material may fill recessions 38 while covering surface 44 with a contiguous formation of the imprinting material. In the present embodiment, sub-portions 54 of imprinting material in superimposition with protrusions 40 remain after the desired, usually minimum, distance "d" has been reached. This action provides formation 50 with sub-portions 52 having a thickness t1, and sub-portions 54, having a thickness t2. Thicknesses "t1" and "t2" may be any thickness desired, dependent upon the application. Thereafter, formation 50 is solidified by exposing the same to the appropriate curing agent, e.g., actinic energy, such as broadband ultra violet energy, thermal energy or the like, depending upon the imprinting material. This causes the imprinting material to polymerize and cross-link. The entire process may occur at ambient temperatures and pressures, or in an environmentally-controlled chamber with desired temperatures and pressures. In this manner, formation 50 is solidified to provide side 56 thereof with a shape conforming to a shape of a surface 58 of mold 36.

Figure 3:
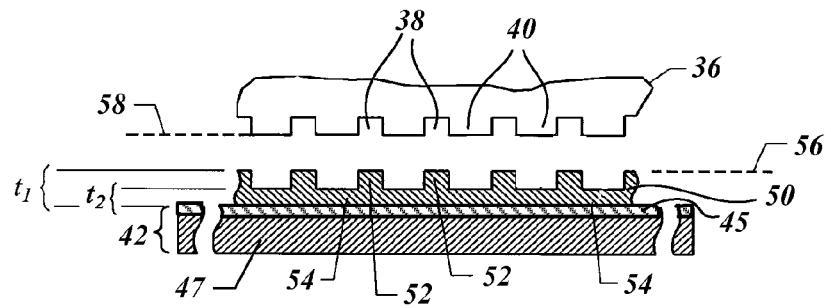
FIG. 3 is a simplified elevation view of the template and substrate, shown in FIG. 2, with the imprinting material being shown as patterned and solidified upon the layer.

Referring to FIGS. 1, 2 and 3, the characteristics of the imprinting material are important to efficiently pattern substrate 42 in light of the unique patterning process employed. For example, it is desired that the imprinting material have certain characteristics to facilitate rapid and even filling of the features of mold 36 so that all thicknesses t1 are substantially uniform and all thicknesses t2 are substantially uniform. To that end, it is desirable that the viscosity of the imprinting material be established, based upon the deposition process employed, to achieve the aforementioned characteristics. As mentioned above, the imprinting material may be deposited on substrate 42 employing various techniques. Were the imprinting material deposited as a plurality of discrete and spaced-apart droplets 46, it would be desirable that a composition from which the imprinting material is formed have relatively low viscosity, e.g., in a range of 0.5 to 20 centipoises (cP). Considering that the imprinting material is spread and patterned concurrently, with the pattern being subsequently solidified into formation 50 by exposure to radiation, it would be desired to have the composition wet surface of substrate 42 and/or mold 36 and to avoid subsequent pit or hole formation after polymerization. Were the imprinting material deposited employing spin-coating techniques, it would be desired to use higher viscosity materials, e.g., having a viscosity greater than 10 cP and typically, several hundred to several thousand cP, with the viscosity measurement being determined in the absence of a solvent.

In addition to the aforementioned characteristics, referred to as liquid phase characteristics, it is desirable that the composition provides the imprinting material with certain solidified phase characteristics. For example, after solidification of formation 50, it is desirable that preferential adhesion and release characteristics be demonstrated by the imprinting material. Specifically, it is beneficial for the composition from which the imprinting material is fabricated to provide formation 50 with preferential adhesion to substrate 42 and preferential release of mold 36. In this fashion, reduced is the probability of distortions in the recorded pattern resulting from the separation of mold 36 therefrom due to, inter alia, tearing, stretching or other structural degradation of formation 50.

The constituent components of the composition that form the imprinting material to provide the aforementioned characteristics may differ. This results from substrate 42 being formed from a number of different materials. As a result, the chemical composition of surface 44 varies dependent upon the material from which substrate 42 is formed. For example, substrate 42 may be formed from silicon, plastics, gallium arsenide, mercury telluride, and composites thereof. As mentioned above, substrate 42 may include one or more layers shown as primer layer 45, e.g., dielectric layer, metal layer, semiconductor layer, planarization layer and the like, upon which formation 50 is generated. To that end, primer layer 45 would be deposited upon a wafer 47 employing any suitable technique, such as chemical vapor deposition, spin-coating and the like. Additionally, primer layer 45 may be formed from any suitable material, such as silicon, germanium and the like. Additionally, mold 36 may be formed from several materials, e.g., fused-silica, quartz, indium tin oxide diamond-like carbon, MoSi, sol-gels and the like.

It has been found that the composition from which formation 50 is generated may be fabricated from several different families of bulk materials. For example, the composition may be fabricated from vinyl ethers, methacrylates, epoxies, thiol-enes and acrylates, just to name a few.

An exemplary bulk material from which to form formation 50 is as follows:

Bulk Imprinting Material isobornyl acrylate
n-hexyl acrylate
ethylene glycol diacrylate
2-hydroxy-2-methyl-1-phenyl-propan-1-one The acrylate component, isobornyl acrylate (IBOA), has the following structure:

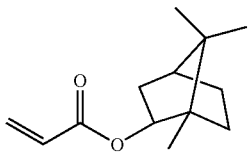

and comprises approximately 47% of bulk material by weight, but may be present in a range of 20% to 80%, inclusive. As a result, the mechanical properties of formation 50 are primarily attributable to IBOA. An exemplary source for IBOA is Sartomer Company, Inc. of Exton, Pa. available under the product name SR 506.

The component n-hexyl acrylate (n-HA) has the following structure:

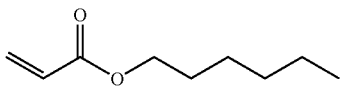

and comprises approximately 25% of bulk material by weight, but may be present in a range of 0% to 50%, inclusive. Also providing flexibility to formation 50, n-HA is employed to reduce the viscosity of the bulk material so that bulk material, in the liquid phase, has a viscosity less than about 10 cP. An exemplary source for the n-HA component is the Aldrich Chemical Company of Milwaukee, Wis.

A cross-linking component, ethylene glycol diacrylate, has the following structure:

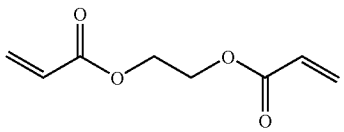

and comprises approximately 25% of bulk material by weight, and may be present in a range of 10% to 50%, inclusive. EGDA also contributes to the modulus and stiffness buildup, as well as facilitates cross-linking of n-HA and IBOA during polymerization of the bulk material.

An initiator component, 2-hydroxy-2-methyl-1-phenyl-propan-1-one is available from Ciba Specialty Chemicals of Tarrytown, N.Y. under the trade name DAROCUR® 1173, and has the following structure:

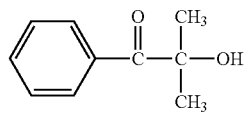

and comprises approximately 3% of the bulk material by weight, and may be present in a range of 1% to 5%, inclusive. The actinic energy to which the initiator is responsive is broad band ultra-violet energy generated by a medium-pressure mercury lamp. In this manner, the initiator facilitates cross-linking and polymerization of the components of the bulk material.

U.S. Pat. No. 7,307,118, which is hereby incorporated by reference herein, describes producing a weak boundary layer, lamella 60, between mold 36, surface 58 and formation 50, shown in FIGS. 3 and 4. Lamella 60 remains after solidification of the imprinting material. As a result, the adhesion forced between mold 36 and formation 50 are minimal. To that end, found beneficial was employing a composition for the imprinting material that includes one of several compositions, such as the BULK IMPRINTING MATERIAL discussed above, along with a component that contains low surface energy groups, referred to as a surfactant component.

Figure 5:
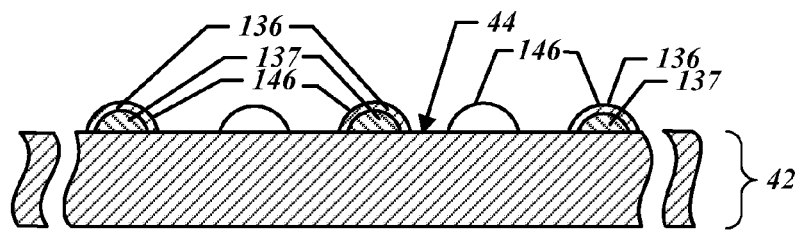
FIG. 5 is a detailed view of the droplets of imprint material, shown in FIG. 2, showing the bifurcation of the droplets into surfactant-rich regions and surfactant-depleted regions.

Referring to FIG. 5, after deposition of the imprinting material, the surfactant component rises, after a period of time, to the air liquid interface, providing droplets 146 of imprinting material with a bifurcated concentration of materials. In a first portion, droplets 146 include a higher concentration of the surfactant component, referred to as a surfactant-component-rich (SCR) sub-portion 136, than the second portion, referred to as a surfactant-component-depleted (SCD) sub-portion 137. SCD sub-portion 137 is positioned between surface 44 and SCR sub-portion 136. SCR sub-portion 136 attenuates the adhesion forces between mold 36 and the imprinting material, once the imprinting material is solidified. Specifically, the surfactant component has opposed ends. When the imprinting material is in the liquid phase, i.e., polymerizable, one of the opposed ends has an affinity for the bulk material included in the imprinting material. The remaining end has a fluorine component.

Figure 4:
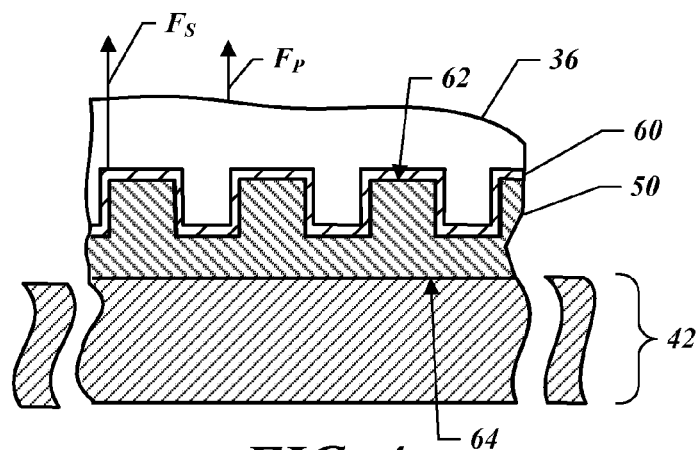
FIG. 4 is a cross-sectional view of the template contacting imprinting material demonstrating the formation of the weak boundary lamella between solidified imprinting material and a template.

Referring to FIGS. 4 and 5, as a result of the affinity for the bulk material, the surfactant component is orientated so that the fluorine component extends from an air-liquid interface defined by the imprinting material and the surrounding ambient.

Upon solidification of the imprinting material, a first portion of the imprinting material generates a lamella 60 and a second portion of the imprinting material is solidified, i.e., polymeric material shown as formation 50. Lamella 60 is positioned between formation 50 and mold 36. Lamella 60 results from the presence and location of the fluorine components in the SCR sub-portion 136. Lamella 60 prevents strong adhesion forces from being developed between mold 36 and formation 50. Specifically, formation 50 has first and second opposed sides 62 and 64. Side 62 adheres to mold 36 with a first adhesion force. Side 64 adheres to substrate 42 with a second adhesion force. Lamella 60 results in the first adhesion force being less than the second adhesion force. As a result, mold 36 may be easily removed from formation 50 while minimizing distortions and/or the force required to separate mold 36 therefrom. Although formation 50 is shown with side 62 being patterned, it should be understood that side 62 may be smooth, if not planar.

Furthermore, if desired, it is possible to generate lamella 60 so as to be disposed between formation 50 and substrate 42.

Figure 6:
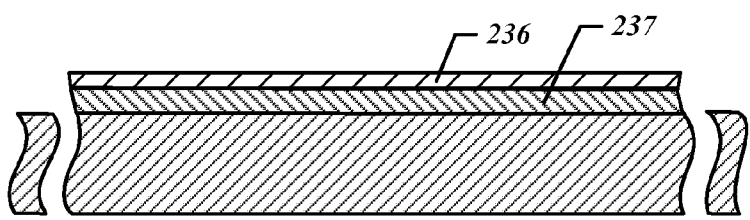
FIG. 6 is a detailed view of a layer of imprinting material, deposited employing spin-on techniques, showing the bifurcation of the layer into surfactant-rich regions and surfactant-depleted regions.

This may be achieved, for example, by applying imprinting material to mold 36 and subsequently contacting substrate 42 with the imprinting material on mold 36. In this manner, it can be said that formation 50 will be disposed between lamella 60 and the body, e.g., mold 36 or substrate 42, upon which the polymerizable material is deposited. It should be understood that were the imprinting material deposited employing spin-coating techniques, similar bifurcated concentration of materials occurs, as shown in FIG. 6 with respect to SCR sub-portion 236 and second and SCD sub-portion 237. The time required for the bifurcation is dependent upon several factors, including the size of molecules in the composition and the viscosity of the composition. Only a few seconds is needed to achieve the aforementioned bifurcation of composition with viscosity below 20 cP. Material with viscosity in the hundreds of cPs, however, may require a few seconds to several minutes.

It has been discovered, however, that lamella 60 may not be uniform. Some regions of lamella 60 are thinner than others, and in some extreme cases, lamella 60 may be absent in an extremely small percentage of the template surface so that template 36 is in contact with formation 50. As a result of the thinner regions of lamella 60 and in the absence of lamella 60, distortion and/or delamination of formation 50 from substrate 42 may occur. Specifically, upon separation of mold 36, formation 50 is subjected to a separation force FS. Separation force FS is attributable to a pulling force FP on mold 36 and adhering forces, e.g., Van der Waals forces, between formation 50 and mold 36 as reduced by lamella 60. Due to the presence of lamella 60, separation force FS typically has a magnitude that is less than the magnitude of an adhering force FA between formation 50 and substrate 42. However, with the reduction, or absence, of lamella 60, local separation force FS may approach the magnitude of local adhering force FA. By local forces what is meant are the forces present in a given region of lamella layer 60, which in this example are the local forces proximate to a thin region of lamella layer 60 or where lamella layer 60 is substantially absent. This leads to distortion and/or delamination of formation 50 from substrate 42.

Figure 7:
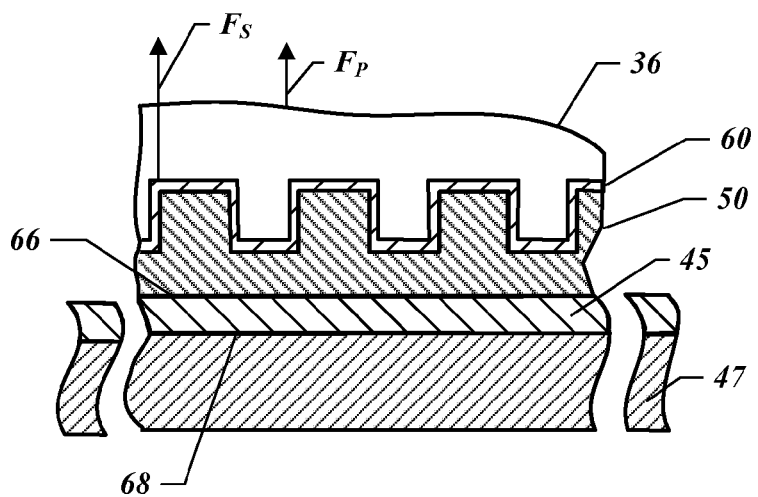
FIG. 7 is a cross-sectional view of the template contacting solidified imprinting material, deposited as shown in either FIG. 5 or 6, formed on a substrate including a primer layer.

Referring to FIG. 7, in the presence of primer layer 45, a more complex situation exists due to the presence of two interfaces 66 and 68. At a first interface 66 a first adhering force F1 is present between primer layer 45 and formation 50. At a second interface 68 a second adhering force, F2, is present between primer layer 45 and wafer 47. It is desired that the separation force FS have a magnitude that is less than either adhering forces F1 and F2. However, due to variations in the thickness, or absence, of lamella 60, as discussed above, separation force FS may be similar or approach the magnitude of one or both of adhering forces F1 and F2. This may cause delamination of formation 50 from primer layer 45, primer layer 45 from wafer 47 or both.

The present invention reduces, if not avoids, the delamination problem mentioned above by forming primer layer 45 from a material that increases the probability that first F1 and second F2 adhering forces of the first and second interface, respectively, are greater than the separation force FS in view of lamella layer fluctuations. To that end, primer layer 45 is formed from a composition that forms strong bonds at interface 66, i.e., between primer layer 45 and formation 50, as well as, i.e., between interface 66, primer layer 45 and wafer 47. In the present example, adhesion between primer layer 45 and formation 50 at first interface 66 is the result of covalent bonding, i.e., covalent bonds between the composition from which primer layer 45 is formed and the composition from which formation 50 is formed are present. Adhesion between primer layer 45 and wafer 47 may be achieved through any one of various mechanisms. These mechanisms may include covalent bonds formed between the composition from which primer layer 45 is formed and the material from which wafer 47 is formed. Alternatively, or in addition to, the covalent bonds, ionic bonds may be formed between the composition from which primer layer 45 is formed and the material from which wafer 47 is formed. Alternatively, or in addition to, the covalent bonds, and/or the ionic bonds or both, adhesion between the composition from which primer layer 45 is formed and the material from which wafer 47 is formed may be achieved vis-à-vis Van der Waals forces.

This is achieved by forming primer layer 45 from a composition that includes a multi-functional reactive compound, i.e., a compound that contained two or more functional groups generally represented as follows:

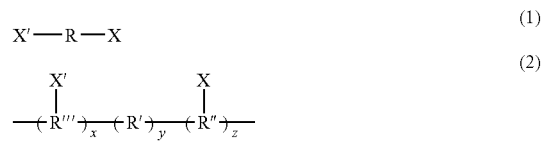

In which R, R', R" and R'" are linking groups and x, y, z are averaged repeating numbers of the groups associated therewith. These repeating units could be randomly distributed. The groups X and X' denote the functional groups, with the understanding that typically, the functional group X differs from functional group X'. One of the functional groups X and X', for example X', is selected to achieve cross-reaction with the material from which substrate 42 is formed to adhere thereto by forming a covalent bond therewith, ionic bond therewith and/or Van der Waals forces.

One of the remaining functional groups X and X', for example X, is selected to achieve cross-reaction with the material from which formation 50 is formed to form a covalent bond therebetween. The functionality of the X group is established so the cross-reaction occurs during polymerization of formation 50. As a result, the selection of functional group X depends upon the characteristics of the material from which formation 50 is formed, it is desired that functional group X reacts with the functional groups of the composition from which formation 50 is formed. For example, were formation 50 formed from acrylate monomers, X may be comprised of acrylic, vinyl ether, and or alkoxyl functional groups, and/or functional groups that can copolymerize with acrylic groups in formation 50. As a result, X functional groups cross-react in response to ultraviolet actinic energy.

Functional groups X' may also participate in the cross-linking and polymerization reactions of primer layer 45. Typically, X' functional groups facilitate polymerization and cross-linking in response to an actinic energy that differs from the actinic energy in response to which X functional groups cross-react. The X' functional groups in the present example facilitate cross-linking of molecules in primer layer 45 in response to exposure to thermal energy. Typically, functional groups X' are selected to facilitate cross-reaction with substrate 42 through three mechanisms: 1) direct reaction with material from which substrate 42 is formed; 2) reaction with cross-linker molecules with a linking functional group of the cross-linker reacting with substrate 42; and 3) polymerization of and cross-linking of primer layer 45 so that chains of molecules of sufficient length may be developed to connected between formation 50 and substrate 42.

Figure 8:
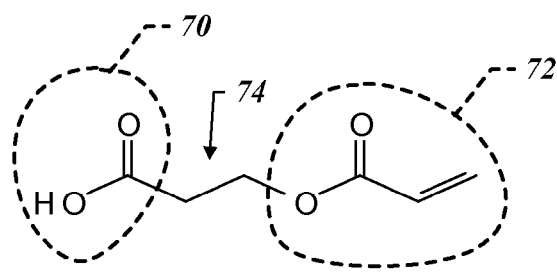
FIG. 8 illustrates a chemical structure of a component of a composition that may be employed to form a primer layer.

Referring to FIGS. 7 and 8, an exemplary multi-functional reactive compound that may be employed to form primer layer 45 in the presence of formation 50 being formed from BULK MATERIAL includes a β-carboxyethyl acrylate, available from UCB Chemicals in Smyrna, Ga. under the product name β-CEA. β-CEA is an aliphatic compound having the following structure:

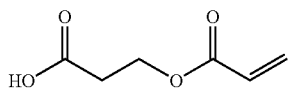

The X' functional group 70 provides carboxylic functionality. The X functional group 72 provides acrylate functionality. Functional groups 70 and 72 are coupled to opposing ends of a backbone component 74.

Figure 9:
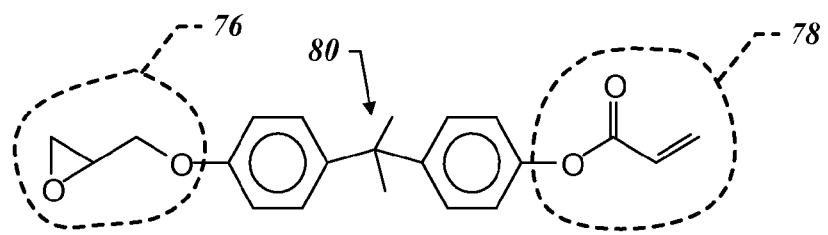
FIG. 9 illustrates a chemical structure of a component of a composition that may be employed to form a primer layer.

Referring to FIGS. 7 and 9, another multi-functional reactive compound that may be employed to form primer layer 45 in the presence of formation 50 being formed from BULK MATERIAL includes an aromatic bis-phenyl compound available from UCB Chemicals in Smyrna, Ga. under the product name EBECRYL® 3605 that has the following structure:

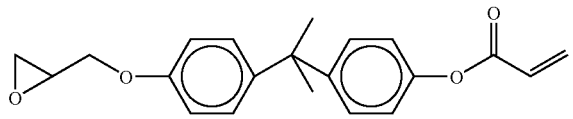

The X' functional group 76 provides epoxy functionality. The X functional group 78 provides acrylate functionality. Functional groups 76 and 78 are coupled to opposing ends of a backbone component 80.

Figure 10:
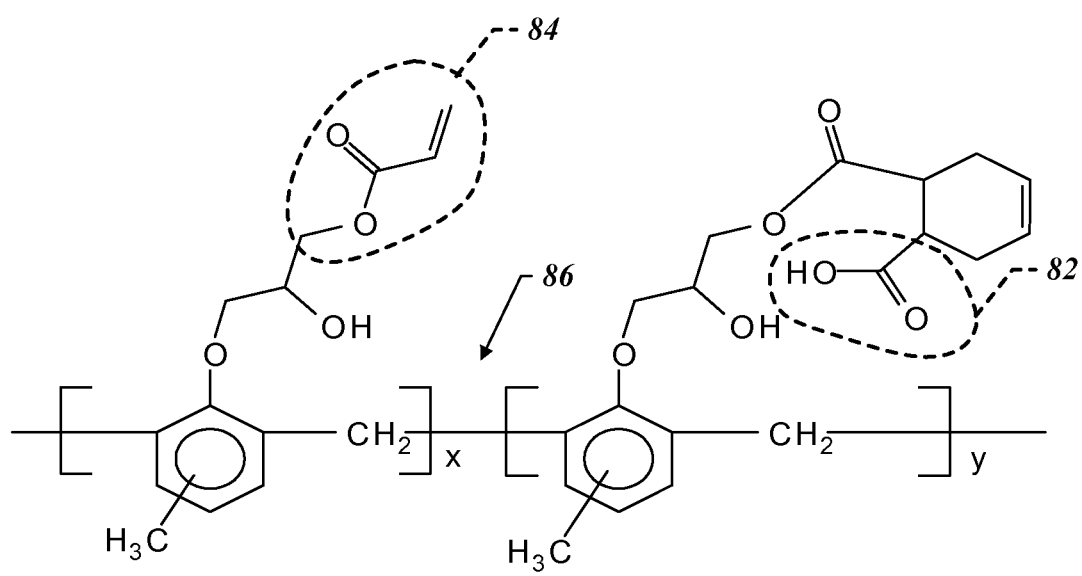
FIG. 10 illustrates a chemical structure of a component of a composition that may be employed to form the primer layer.

Referring to FIGS. 7 and 10, another multi-functional reactive compound that may be employed to form primer layer 45 in the presence of formation 50 being formed from BULK MATERIAL includes an aromatic compound available from Schenectady International, Inc. in Schenectady, N.Y. under the product name ISORAD® 501. The X' functional group 82 provides carboxylic functionality. The X functional group 84 provides acrylate functionality. Functional groups 82 and 84 are coupled to opposing ends of a backbone component 86.

Depending on synthesis procedures, ISORAD® 501 may have Structure A or B shown below, or a similar structure.

Structure A

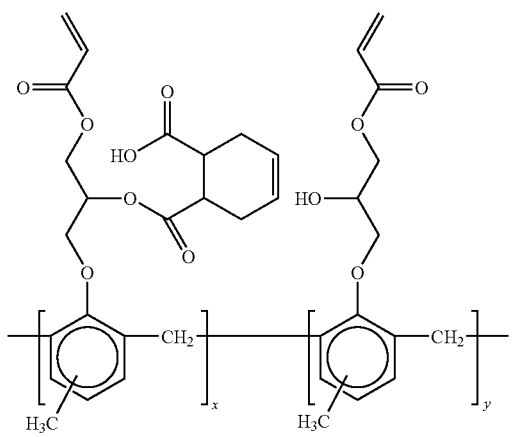

Structure B

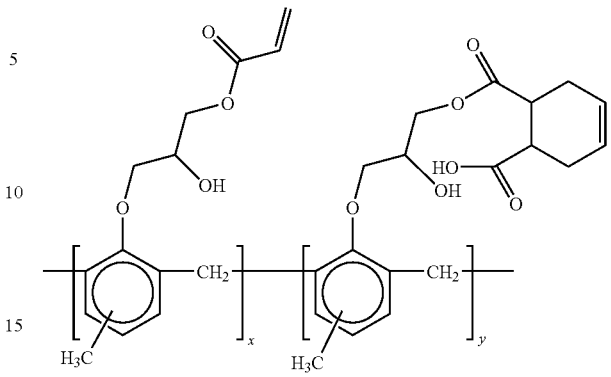

In Structures A and B, x and y are integers indicating a number of repeating units. The repeating units may be randomly distributed.

Structures A and B may be made from a cresol epoxy novolac shown below, such that x+y=n, a repeating number that ranges from 8 to 11 inclusive. Thus, the molecular weights of Structures A and B are in the range of about 2,000 to about 4,000 Dalton.

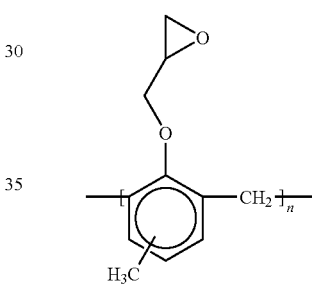

The high molecular weights of Structures A and B contributes to the mechanical strength build up of the adhesion layer. Using a generally accepted carbon-carbon bond length of about 0.14 nm, the polymeric backbones of Structures A and B, if extended linearly, are in a range of about 2 nm to about 4 nm.

Figure 11:
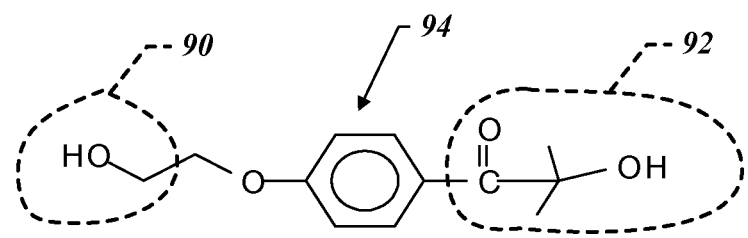
FIG. 11 illustrates a chemical structure of a component of a composition that may be employed to form a primer layer.

Referring to FIGS. 7 and 11, in addition to cross-reaction with formation 50, functional group X may generate radicals that function to facilitate polymerization of the composition from which formation 50 is formed during solidification of the same. As a result, the functional group X would facilitate polymerization of formation 50 upon exposure to actinic energy, e.g., broad band ultraviolet energy. An exemplary multi-functional reactive compound that includes these properties is a photo-initiator available from Ciba Specialty Chemicals in Tarrytown, N.Y. under the tradename IRGACURE® 2959 and has the following structure:

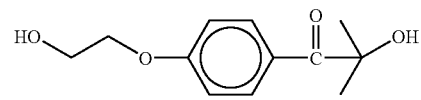

The X' functional group 90 provides hydroxyl functionality. The X functional group 92 provides initiator-type functionality. Specifically, in response to exposure to broad band ultraviolet energy the functional group X undergoes alpha-cleavage to generate benzoyl type of radicals. The radicals facilitate radical polymerization of the composition from which formation 50 is formed. Functional groups 90 and 92 are coupled to opposing ends of a backbone component 94.

Several compositions were formed including some of the aforementioned the multi-functional reactive compounds to determine the adhering strength of interfaces 66 and 68. An exemplary composition including a multi-functional reactive compound is as follows:

Composition 1

β-CEA
DUV30J-16
where DUV30J-16 comprises approximately 100 grams of composition 1 and β-CEA comprises approximately 0.219 grams. DUV30J-16 is a bottom anti-reflective coating (BARC) available from Brewer Science in Rolla, Mo. containing 93% solvent, and 7% non-solvent reactive components. DUV30J-16 contains phenolic resins, and its crosslinker can react with carboxylic functional group. It is believed that DUV30J-16 will not form covalent bonds with formation 50.

In another composition, β-CEA was replaced by a cross-linking agent, a catalyst and ISORAD® 501. Both the cross-linking agent and catalyst is sold by Cytec Industries, Inc. of West Patterson, N.J. The cross-linking agent is sold under the product name CYMEL™ 303ULF. A component of CYMEL™ 303ULF is hexamethoxymethyl-melamine (HMMM). The methoxyl functional groups of HMMM can participate in many condensation reactions. The catalyst is sold under the product name CYCAT® 4040 providing the following composition:

Composition 2

DUV30J-16
ISORAD® 501
CYMEL™ 303ULF
CYCAT® 4040

Approximately 100 grams of COMPOSITION 2 comprises DUV30J-16, 0.611 gram of COMPOSITION 2 comprises ISORAD® 501, 0.175 gram of COMPOSITION 2 comprises CYMEL™ 303ULF and 0.008 gram of COMPOSITION 2 comprises CYCAT® 4040.

Another composition that may be employed as the multi-functional reactive compound omits DUV30J-16. The composition is as follows:

Composition 3

ISORAD® 501
CYMEL™ 303ULF
CYCAT® 4040
PM Acetate

Composition 3 includes approximately 77 grams of ISORAD® 501, 22 grams of CYMEL™ 303ULF and one gram of CYCAT® 4040. ISORAD® 501, CYMEL™ 303ULF and CYCAT® 4040 are combined. The combination of ISORAD® 501, CYMEL™ 303ULF and CYCAT® 4040 are then introduced into approximately 1900 grams of PM Acetate. PM Acetate is a product name of a solvent consisting of 2-(1-methoxy)propyl acetate sold by Eastman Chemical Company of Kingsport, Tenn.

COMPOSITION 4, similar to COMPOSITION 3, includes approximately 85.2 grams of ISORAD® 501, 13.8 grams of CYMEL™ 303ULF and one gram of CYCAT® 4040. ISORAD® 501, CYMEL™ 303ULF and CYCAT® 4040 are combined. The combination of ISORAD® 501, CYMEL™ 303ULF and CYCAT® 4040 are then introduced into approximately 1900 grams of PM Acetate.

COMPOSITION 5, similar to COMPOSITION 3, includes approximately 81 grams of ISORAD® 501, 18 grams of CYMEL™ 303ULF and one gram of CYCAT® 4040. ISORAD® 501, CYMEL™ 303ULF and CYCAT® 4040 are combined. The combination of ISORAD® 501, CYMEL™ 303ULF and CYCAT® 4040 are then introduced into approximately 1900 grams of PM Acetate.

Each of the five compositions discussed above with respect to primer layer 45, COMPOSITIONs 1-5, are deposited upon substrate 42 employing spin-coating techniques wherein the substrate is rotated at a velocity between 500 and 4,000 revolutions per minute so as to provide a substantially smooth, if not planar layer with uniform thickness. This is followed by exposing the compositions to thermal actinic energy of 180° C. (Celsius) for approximately two minutes.

The five compositions described above, COMPOSITIONs 1-5, were employed, along with IMPRINTING MATERIAL, to generate comparative data of the strength of the adhesion forces of interfaces 66 and 68 which was compared against baseline measuring of a primer layer 45 formed entirely from DUV30J-16, which is not known to form covalent bonds with formation 50 formed from IMPRINTING MATERIAL. To that end, formation 50, formed from BULK IMPRINTING MATERIAL, and primer layer 45, formed from COMPOSITIONS 1-5 and the base line COMPOSITION, were deposited and then solidified between two glass slides (not shown). Each glass slide (not shown) is approximately 1 mm thick, 75×25 mm in the lateral dimension.

Before deposition of primer layer 45 and formation 50 the glass slides (not shown) are cleaned. Specifically each glass slide (not shown) is exposed to Piranha solution ($H_2SO_4$:$H_2O_2$=2.5:1 by volume). The glass slides (not shown) are subsequently rinsed with de-ionized water, sprayed with isopropyl alcohol, and exposed to a stream of fluid for drying, e.g., a stream of nitrogen gas. Thereafter, the glass slides (not shown) are baked at 120° C. (Celsius) for 2 hours.

Primer layer 45 is deposited onto each of the two glass slides (not shown) employing spin-on techniques with a spin speed up to 3000 rpm. Primer layer 45 is lying on the glass slides (not shown) on hot plates at 180 C for 2 minutes. In other words, each of COMPOSITIONs 1-5, as well as the baseline composition are solidified, i.e., polymerized and cross-linked, by exposure to thermal energy. Formation is formed employing drop dispense techniques mentioned above. Specifically, BULK IMPRINTING MATERIAL is disposed as a plurality of droplets onto primer layer 45 on one of the two glass slides. The BULK IMPRINTING MATERIAL is then sandwiched between two primer layers 45 by having the primer layer on the two glass slides (not shown) facing one another and contacting BULK IMPRINTING MATERIAL. Typically a longitudinal axis of one of the two glass slides (not shown) extends orthogonally to the longitudinal axis of the remaining glass slide (not shown). The BULK IMPRINTING MATERIAL is solidified, i.e., polymerized, and cross-linked by exposing the two glass slides (not shown) to actinic energy, such as broad band ultraviolet wavelengths, using a medium pressure mercury UV lamp for 40 seconds at 20 mW/cm$^2$ intensity.

To measure the strength of the adhesion, a four-point bending fixture (not shown) was adopted for the adhesion test and technique, similar to that described in "Measurement of Adhesive Force Between Mold and Photocurable Resin in Imprint Technology" Japanese Journal of Applied Physics, Vol. 41 (2002) pp. 4194-4197. The maximum force/load was taken as the adhesion value. The beam distance of the top and bottom two points is 60 mm. The load was applied at the speed of 0.5 mm per minute. Employing this test, it was determined that delamination occurred at 6.1 pounds of force when primer layer 45 was formed with the baseline composition. A separation force of approximately 6.5 pounds was reached before delamination occurred with primer layer 45 being formed from COMPOSITION 1. A separation force of approximately 9.1 pounds was reached before delamination occurred with primer layer 45 being formed from COMPOSITION 2. When primer layer 45 was formed from each of COMPOSITIONs 3, 4 or 5, one or both of the two glass slides (not shown) failed (broke) before delamination occurred. As a result, forces of up to 11 pounds were measured without delamination being observed. As a result, it is observed that COMPOSITIONs 3, 4 and 5 provide primer layer 45 with superior operational characteristics in that it effectively prevents delamination were lamella layer 60 to have undesirably thin regions or be altogether absent.

COMPOSITION 6, a low-solids composition similar to COMPOSITION 5, includes 0.81 grams of ISORAD® 501, 0.18 grams CYMEL™ 303ULF, 0.01 grams CYCAT® 4040, and 1999 grams PM Acetate. In an example, COMPOSITION 6 may be cast onto a wafer and spun to form a film. During a spinning process, solvent evaporates, and a thin, solid film is formed on the surface. The percentage of dissolved solids in the composition and the spin coating speed may be adjusted to achieve a desired film thickness on a substrate or wafer. After spin-coating, the adhesion layer may be cured, for example, by contact baking on a hot plate at 150° C. for about 1 minute.

Figure 12A:
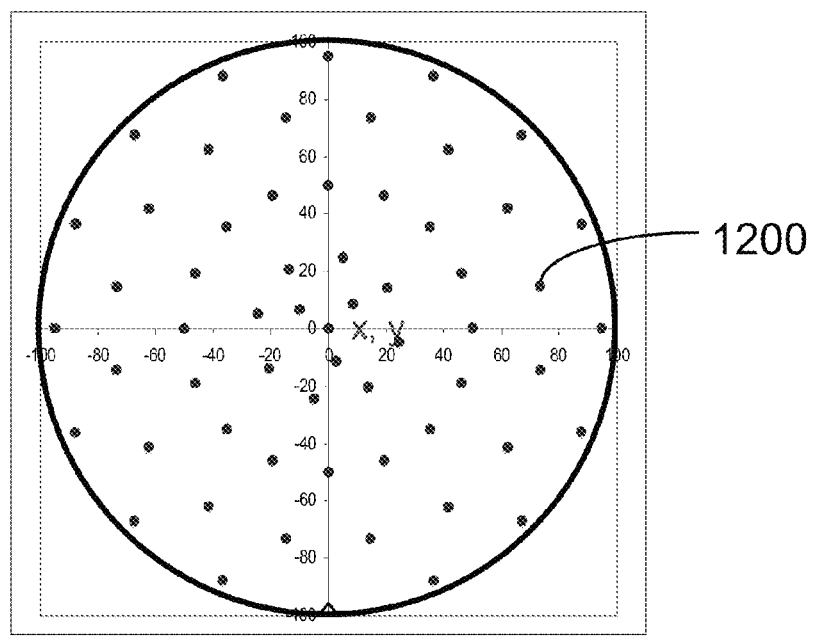
FIGS. 12A and 12B illustrate measurement locations for thickness measurement of a polymeric adhesion layer.
Figure 12B:
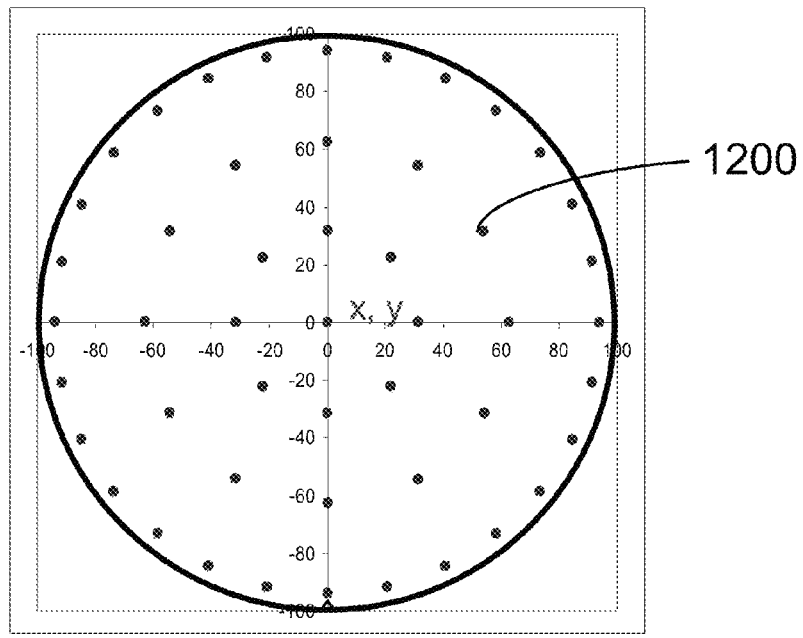

FIGS. 12A and 12B illustrate measurement locations 1200 of polymeric adhesion layer thickness for COMPOSITION 6 applied as described above to an 8" silicon wafer with a spin rate of 1000 rpm. Solid film thickness measurements of the sample were performed by spectroscopic reflectometry with optical metrology systems available from Metrosol, Inc., Austin, Tex. With 59 measurement locations depicted in FIG. 12A, the mean layer thickness was determined to be 1.09 nm, with a maximum measured thickness of 1.22 nm, a minimum measured thickness of 0.94 nm, and a standard deviation of 0.05 nm. With 49 measurement locations depicted in FIG. 12B, the mean layer thickness was determined, using model VUV-7000, to be 1.01 nm, with a maximum measured thickness of 1.07 nm, a minimum measured thickness of 0.95 nm, and a standard deviation of 0.03 nm.

Figure 13:
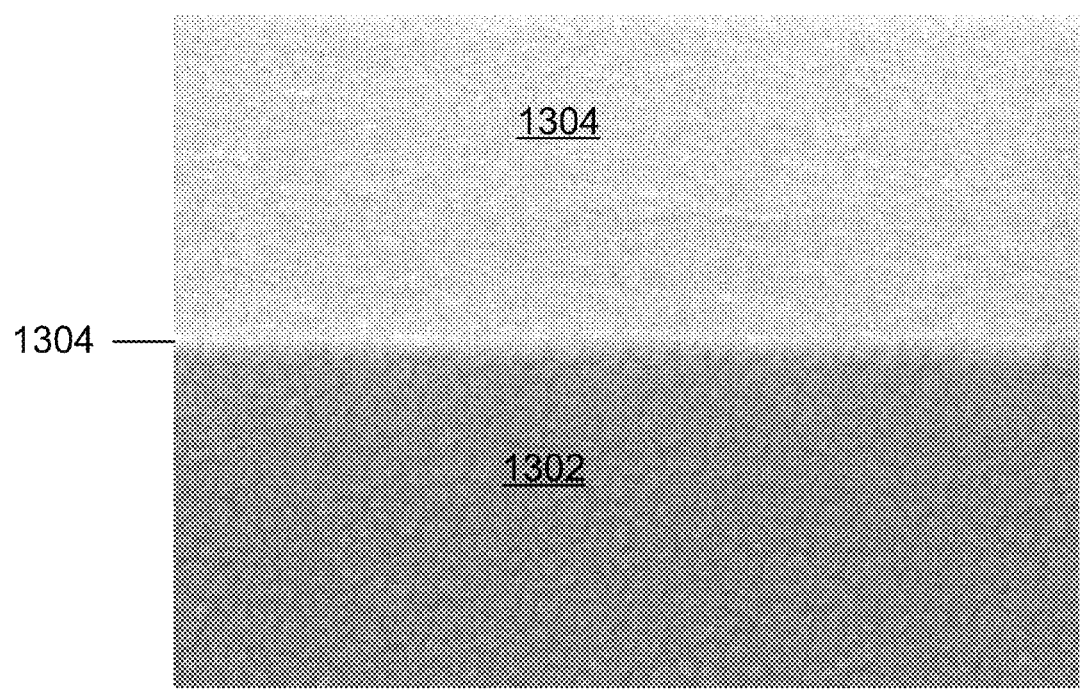
FIG. 13 is a scanning electron micrograph image of a cross-section of silicon wafer coated with a polymeric adhesion layer.

FIG. 13 is a scanning electron micrograph (SEM) image of polymeric adhesion layer 1300 formed from COMPOSITION 6 between the silicon oxide surface on a silicon wafer 1302 and an acrylate imprint resist 1304. Polymeric adhesion layer 1300 is about 1 nm thick. Testing indicated that the 1-nm-thick polymeric adhesion layer achieves adhesion strength similar to that of a polymeric adhesion layer of a similar composition with a much greater thickness (e.g., greater than about 6 nm). That is, polymeric adhesion layer 1300 does not exhibit cohesive failure under the tensile load applied during template separation.

Surprisingly, spin-coating of a polymeric adhesion layer composition including polymeric components with an extended backbone length greater than about 2 nm (e.g., in a range of about 2 nm to about 4 nm) was shown to form a polymeric adhesion layer with thickness of less than about 2 nm (e.g., about 1 nm). The polymeric components are thought to be aligned during spin-coating such that backbones of the polymeric components are "lying down" on (or more parallel with) the surface of the substrate rather than "standing up" on (or more perpendicular to) the surface of the substrate. The polymeric components, aligned with respect to the surface of the substrate in this way, are thought to be in a planar configuration on the surface of the substrate, with the longer dimensions of the polymeric components generally extended along the surface of the substrate and forming an ultra-thin layer on the substrate. This ultra-thin polymeric adhesion layer demonstrates adhesive strength generally thought to be associated with adhesion layers of much greater thickness, and allows reduction of the overall thickness of imprinting stacks for nano-imprint lithography.

The embodiments of the present invention described above are exemplary. Many changes and modifications may be made to the disclosure recited above while remaining within the scope of the invention. For example, the solvent PM Acetate is employed primarily to dissolve the other constituent components of COMPOSITIONs 3, 4 and 5. As a result, many common photo-resist solvents may be employed in lieu of PM Acetate, such as diethylene glycol monoethyl ether acetate, methyl amyl ketone or the like. Further, the solid contents of COMPOSITIONs 3, 4 and 5, i.e., ISORAD® 501, CYMEL™ 303ULF and CYCAT® 4040 may comprise between 0.1% to 70% of the composition, weight, and more preferably in a range of 0.5% to 10% by weight, with the remaining quantity consisting of the solvent. The solid component of each of COMPOSITIONs 3, 4, and 5 may comprise 50% to 99%, by weight of ISORAD® 501, 1% to 50%, by weight of CYMEL™ 303ULF and 0% to 10% by weight of CYCAT® 4040. The scope of the invention should not, therefore, be limited by the above description, but instead should be determined with reference to the appended claims along with their full scope of equivalents.

What is claimed is:

1. An imprint lithography imprinting stack comprising:
   a substrate;
   a polymeric adhesion layer adhered to the substrate, wherein the polymeric adhesion layer is formed from a polymerizable composition comprising a polymeric component, the polymeric component comprising a repeating aromatic group, and wherein a thickness of the polymeric adhesion layer is less than about 2 nm.

2. The imprinting stack of claim 1, wherein the thickness of the polymeric adhesion layer is about 1 nm.

3. The imprinting stack of claim 1, wherein the polymeric component has an extended backbone length of at least about 2 nm.

4. The imprinting stack of claim 3, wherein the polymeric component is synthesized from a cresol epoxy novolac.

5. The imprinting stack of claim 3, wherein the polymeric component comprises a carboxyl group capable of bonding to the substrate and an additional functional group capable of bonding with an imprint resist.

6. The imprinting stack of claim 1, wherein the polymeric adhesion layer is capable of bonding with an imprint resist during solidification of the imprint resist on the imprinting stack.

7. A method of forming an adhesion layer on an imprint lithography substrate, the method comprising:
   spin-coating a polymerizable composition onto an imprint lithography substrate; and
   solidifying the polymerizable composition to form a polymeric adhesion layer adhered to the imprint lithography substrate, wherein the polymerizable composition comprises a polymeric component, the polymeric component comprising a repeating aromatic group, and wherein a thickness of the polymeric adhesion layer is less than about 2 nm.

8. The method of claim 7, wherein the thickness of the polymeric adhesion layer is about 1 nm.

9. The method of claim 7, wherein the polymeric component has an extended backbone length of at least about 2 nm.

10. The method of claim 7, wherein the polymeric component is synthesized from a cresol epoxy novolac.

11. The method of claim 7, wherein the polymerizable composition comprises a polymeric component, and the polymeric component comprises a carboxyl group capable of bonding to the substrate and an additional functional group capable of bonding with an imprint resist.

12. The method of claim 7, further comprising applying an imprint resist to the polymeric adhesion layer and solidifying the imprint resist, wherein solidifying the imprint resist comprises bonding the imprint resist to the polymeric adhesion layer.

13. An imprint lithography method comprising:
spin-coating a polymerizable composition on an imprint lithography substrate, wherein the polymerizable composition comprises polymeric components, each polymeric component comprising a repeating aromatic group and having an extended backbone length of at least about 2 nm;
substantially aligning the backbones of the polymeric components in a planar configuration on the surface of the imprint lithography substrate; and
solidifying the polymerizable composition to form a polymeric adhesion layer adhered to the imprint lithography substrate, wherein a thickness of the polymeric adhesion layer is less than about 2 nm.

14. The method of claim 13, wherein the thickness of the polymeric adhesion layer is about 1 nm.

15. The method of claim 13, wherein the polymeric component is synthesized from a cresol epoxy novolac.

16. The method of claim 13, wherein the polymeric component comprises a carboxyl group capable of bonding to the substrate and an additional functional group capable of bonding with an imprint resist.

17. The method of claim 13, wherein the polymeric adhesion layer is capable of bonding with an imprint resist during solidification of the imprint resist on the imprinting stack.

* * * * *